United States Patent [19]

Suda et al.

[11] Patent Number: 4,705,599
[45] Date of Patent: Nov. 10, 1987

[54] METHOD FOR FABRICATING BIPOLAR TRANSISTOR IN INTEGRATED CIRCUIT

[75] Inventors: Kakutaro Suda; Tadashi Hirao, both of Itami, Japan

[73] Assignee: Mitsubishi Denki Kabushiki Kaisha, Tokyo, Japan

[21] Appl. No.: 900,444

[22] Filed: Aug. 26, 1986

[30] Foreign Application Priority Data

Aug. 28, 1985 [JP] Japan .................................. 60-191013

[51] Int. Cl.[4] ...................... H01L 21/306; B44C 1/22; C03C 15/00; C03C 25/06
[52] U.S. Cl. .................................... 156/653; 156/648; 156/657; 156/661.1; 156/662; 357/34; 357/43; 437/33; 437/193; 437/200
[58] Field of Search ............... 156/648, 652, 653, 655, 156/657, 659.1, 661.1, 662; 29/571, 576 W, 580, 576 B, 578; 148/1.5, 187–190; 427/88, 93, 94; 357/23.1, 23.11, 34, 43, 47–50, 59

[56] References Cited

U.S. PATENT DOCUMENTS

| 4,445,268 | 5/1984 | Hirao | 29/571 |
| 4,484,388 | 11/1984 | Iwasaki | 29/571 |
| 4,486,942 | 12/1984 | Hirao | 29/571 |

OTHER PUBLICATIONS

S. P. Murarka, Silicides for VLSI Applications, pp. 66–69, 1983, Academic Press.
"Subnanosecond Self-Aligned I²L/MTL Circuits", D. D. Tang et al, *IEEE Transactions on Electron Device*, vol. ED-27, No. 8, Aug. 1980, pp. 1379–1384.

*Primary Examiner*—William A. Powell
*Attorney, Agent, or Firm*—Lowe Price LeBlanc Becker & Shur

[57] ABSTRACT

In a method for fabricating a bipolar transistor in accordance with the present invention, a base electrode (9a) of metal silicide is formed being separated from an emitter region (7) only by the thickness of a double-layered insulator film (109, 203).

2 Claims, 23 Drawing Figures

METHOD FOR FABRICATING BIPOLAR TRANSISTOR IN INTEGRATED CIRCUIT

BACKGROUND OF THE INVENTION

1. Field of the Invention

The present invention generally relates to a method for fabricating a bipolar transistor in an integrated circuit (IC), and more particularly, it relates to an improvement in a method for fabricating electrode contact portions of the bipolar transistor.

2. Description of the Prior Art

In general, a bipolar transistor in an IC is formed in an island which is isolated electrically by a method such as p-n junction isolation, oxide film isolation or triple diffusion. Such a semiconductor device is disclosed in, e.g., U.S. Pat. No. 4,445,268, and formation of a self-aligned semiconductor device is disclosed in "Subnanosecond Self-Aligned I$^2$L/MTL Circuits", *IEEE Transactions on Electron Device*, Vol. ED-27, No. 8, August 1980, P. 1379. Further, silicides for IC applications are described by T. Hirao et al. in Extended Abstracts of the 17th Conference on Solid State Devices and Materials, Tokyo, 1985, pp. 381–384 and by S. P. Murarka in SILICIDES FOR VLSI APPLICATIONS, pp. 66–69, 1983, Academic Press.

Figure 1A:
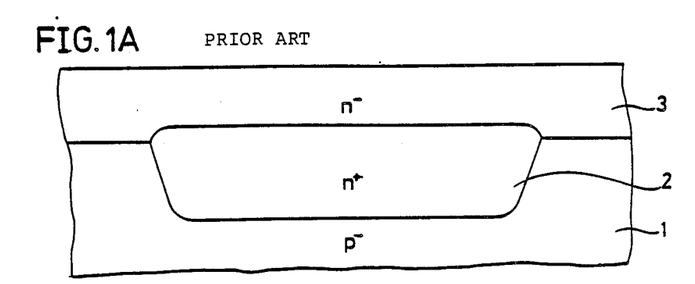
FIGS. 1A to 1E are sectional views showing the principal steps of a conventional method of fabricating a bipolar transistor in an IC.

FIGS. 1A to 1E are cross-sectional views showing the principal steps of a conventional method of fabricating a bipolar transistor in an IC. The conventional method is now described with reference to these drawings. An n$^+$-type layer 2 of high impurity concentration for implementing a buried collector layer is selectively formed on a p$^-$-type silicon substrate 1 of low impurity concentration, followed by growth of an n$^-$-type epitaxial layer 3 thereover (FIG. 1A).

Figure 1B:
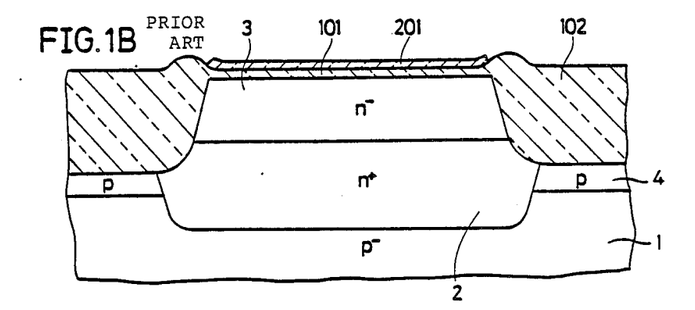

Then, the substance is selectively oxidized by utilizing a nitride mask film 201 on an under-layer oxide film 101, whereby a thick isolation oxide film 102 is formed while a p-type channel-cut layer 4 is simultaneously formed under the isolation oxide film 102 (FIG. 1B).

Figure 1C:
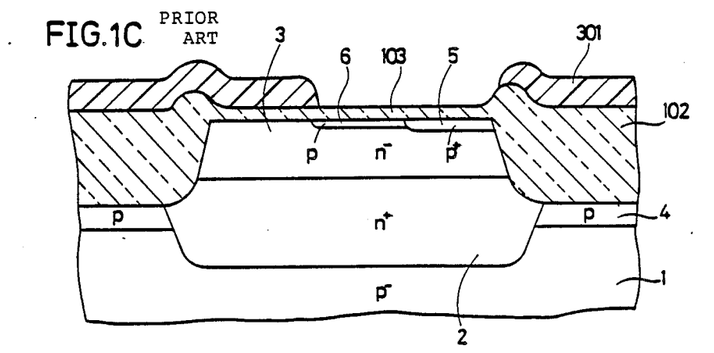

The nitride film 201 and the under-layer oxide film 101 are then removed to newly form an oxide film 103 for preventing ion channelling in the silicon crystal during ion implantation by which a p$^+$-type layer 5 for implementing an extrinsic base layer at a later stage is formed with a photoresist mask film (this mask film is not shown). Thereafter, the photoresist film is removed to newly form a photoresist mask film 301 with which a p-type layer 6 for implementing an active base layer at a later stage is formed by ion implantation (FIG. 1C).

Figure 1D:
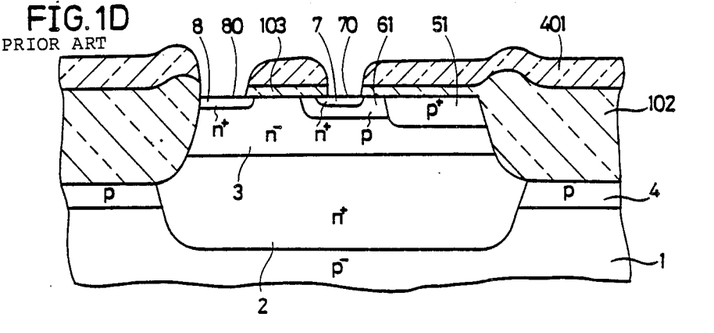

The photoresist film 301 is then removed and the substance is covered by a passivation film 401 generally made of phospho-silicate glass (PSG). The substance is then subjected to a heat treatment for annealing the ion implanted layers 5 and 6 to form an extrinsic base layer 51 and an active base layer 61 at an intermediate stage as well as densificating the PSG film 401, followed by formation of holes 70 and 80 through both the PSG film 401 and the oxide film 103 to form an n$^+$-type layer 7 for implementing an emitter layer and an n$^+$-type layer 8 for implementing a low resistance layer underneath a collector electrode by ion implantation (FIG. 1D).

Thereafter, the respective ion implanted layers are annealed to complete an extrinsic base layer 52 and an active base layer 62 and to form an emitter layer 71 and a low resistance layer 81, followed by formation of hole 50 for a base electrode. Then, the respective holes 50, 70 and 80 are provided with films 501 of metal silicide such as platinum silicide (Pt-Si) or palladium silicide (Pd-Si) for preventing junction-spike of the electrodes, followed by formation of a base lead wire 9, an emitter lead wire 10 and a collector lead wire 11 made of a low-resistance metal such as aluminum (Al) (FIG. 1E).

Figure 1E:
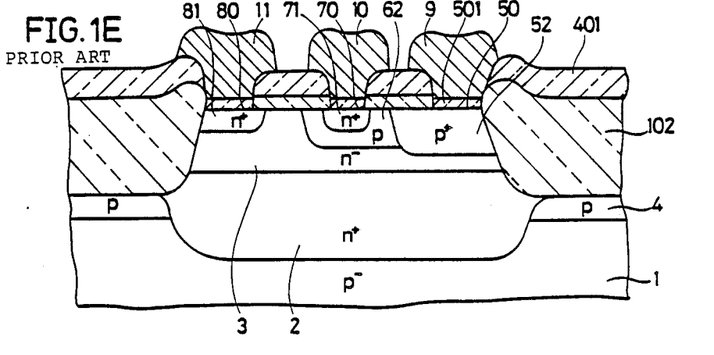
Figure 2:
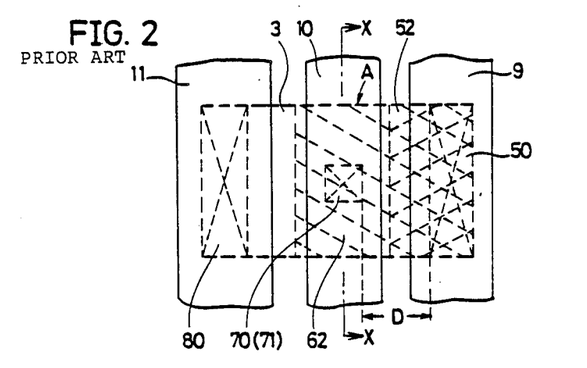
FIG. 2 is a plan view showing a surface pattern of single-base structure of the transistor shown in FIG. 1E.

FIG. 2 is a plan view showing a pattern of single-base structure which corresponds to FIG. 1E.

Generally, the frequency characteristic of a bipolar transistor depends on the base-collector capacitance and the base resistance, both of which must be decreased for improving the frequency characteristic. The p$^+$-type extrinsic base layer 52 is provided for lowering the base resistance in the aforementioned structure, whereas the provision of the same leads to increase in the base-collector capacitance. In FIG. 2, an inactive base area between the emitter area 71 and an isolation oxide film boundary A also increases the base-collector capacitance. Thus, the emitter area 71 may be bounded by the isolation oxide film to be in walled emitter structure. However, such a method involves various disadvantages as will be seen from FIGS. 3A to 3C.

Figure 3A:
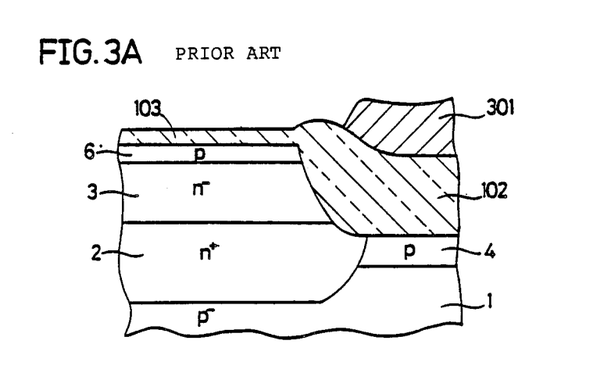
FIGS. 3A to 3C are partial enlarged sectional views for illustrating a transistor fabricated by a conventional method such that an emitter layer is bounded by an isolation oxide film.
Figure 3B:
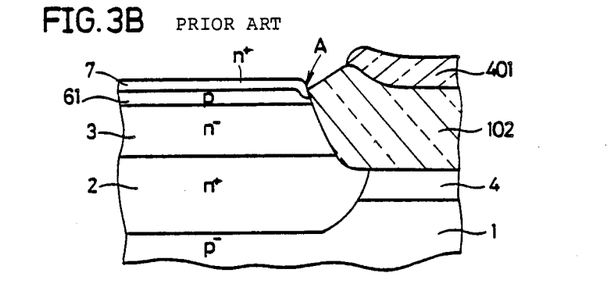
Figure 3C:
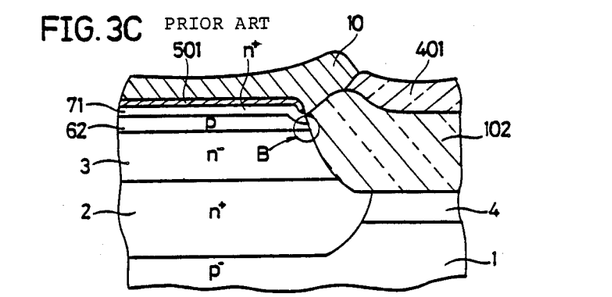

FIGS. 3A to 3C are partial enlarged sectional views taken along the line X—X in FIG. 2. In FIG. 3A, boron is injected with a photoresist mask film 301 to form a base layer. Then, etching in the walled emitter structure is enhanced at the boundary of an isolation oxide film 102 as indicated by a character A in FIG. 3B, and thus the emitter layer 71 is locally deepened as shown at B in FIG. 3C. Thus, lowered is controllability of the current amplification factor and increased is possibility of emitter-collector short circuit at the point B in FIG. 3C.

Further, as shown in FIG. 2, the base resistance depends on a separation D between the emitter area 71 and the base electrode 501 (hole 50), i.e., the separation between the base wire 9 and the emitter wire 10 plus the total width of margins of the respective wires 9 and 10 extending beyond the respective width of holes 50 and 70, and such margins inevitably remain even if the distance between the lead wires 9 and 10 is reduced by improving accuracy of photoetching.

Figure 4:
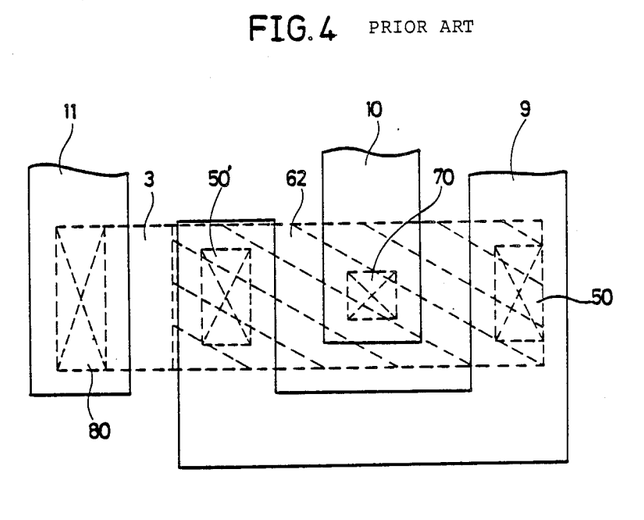
FIG. 4 is a plan view showing a pattern of double-base structure of a conventional transistor.

The transistor may also be brought in the double-base structure as shown in FIG. 4 for reducing the base resistance, as well known in the art. However, the increased base area in the double-base structure results in increase of the base-collector capacitance.

Further, in the conventional fabricating method, the emitter-base interface is formed deeper than the base surface on which the base electrode is formed as seen in FIG. 1E, and this fact causes a problem that the current amplification factor is strongly dependent on the current. Namely, in the range of small current, the current is partly absorbed due to the recombination of electrons and positive holes in the vicinity of the emitter-base interface, and thus the controllability of the current amplification factor is not good.

SUMMARY OF THE INVENTION

In view of the prior art, it is a principal object of the present invention to provide a method for fabricating a bipolar transistor in an IC, the frequency characteristic of which is improved by lowering both the base resistance and the base-collector capacitance.

It is another object of the present invention to provide a method for fabricating a bipolar transistor, the current amplification factor of which is less dependent on the current even in the range of small current.

A method for fabricating a bipolar transistor in accordance with the present invention comprises the steps of: preparing a collector layer of a first conductivity type surrounded by an isolation oxide layer on a semiconductor substrate; forming a multilayered film pattern by etching with a photoresist layer mask thereon, the multilayered film including a polysilicon layer, a nitride layer and an oxide layer stacked in this order on the collector layer; retracting the oxide layer into between the nitride layer and the photoresist layer by side etching; selectively forming a first oxide film on the collector layer, utilizing the nitride layer as a mask; etching down through the nitride layer and the polysilicon layer to a prescribed depth of the collector layer by anisotropic etching, utilizing both the side-etched oxide layer and the first oxide film as a mask; forming a second oxide film on the etched and exposed surface area between the nitride layer region and the first oxide film region; removing the nitride layer; introducing an impurity of the first conductivity type into the polysilicon layer, utilizing the second oxide film as a mask; removing some of the second oxide film regions to expose regions in which a base layer and an emitter layer are going to be formed; implanting impurity ions into the exposed region to form a second conductivity type layer for implementing the base layer; implanting silicon ions into not only the exposed region but also predetermined regions of the first oxide film, the predetermined regions neighboring on the exposed region; subjecting the substrate to a heat treatment to complete the base layer by annealing the second conductivity type layer and simultaneously form an emitter layer by diffusion of the first conductivity type impurity from one of the polysilicon layer regions; subjecting the substrate to an oxidation treatment at a relatively lower temperature to cover the exposed region with an oxide film, followed by formation of a nitride film thereover to provide a double-layered insulator film; anisotropically etching the double-layered insulator film to leave it only on the side walls of both the emitter layer and the polysilicon layer thereon; and forming a base electrode and an emitter electrode on the silicon-implanted region, which are made of a metal silicide and insulated from each other by the double-layered insulator film.

These objects and other objects, features, aspects and advantages of the present invention will become more apparent from the following detailed description of the present invention when taken in conjunction with the accompanying drawings.

DESCRIPTION OF THE PREFERRED EMBODIMENT

FIGS. 5A to 5K are sectional views showing the principal steps of a method of fabricating a bipolar transistor according to an embodiment of the present invention, and elements equivalent to those in FIGS. 1A to 1E are indicated by the same reference numerals.

Figure 5A:
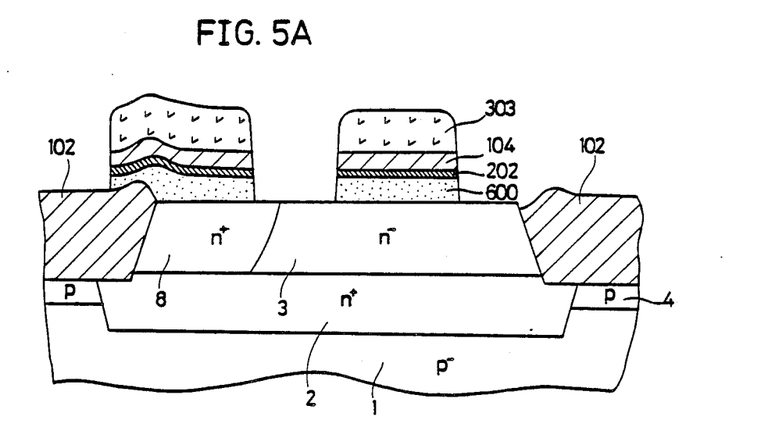
FIGS. 5A to 5K are sectional views showing the principal steps of a method of fabricating a bipolar transistor according to an embodiment of the present invention.

Referring to FIG. 5A, similarly to the steps of the conventional method as shown in FIGS. 1A and 1B, formed on a $p^-$-type silicon substrate 1 are an $n^+$-type buried collector layer 2, an $n^-$-type epitaxial layer region 3, an $n^+$-type epitaxial layer region 8 for collector contact, a p-type channel-cut layer 4 and an isolation oxide layer 102, and then removed are a nitride mask 201 and an under-layer oxide film 101. Thereafter, the surface of the substance is covered with a multilayered film which comprises a polysilicon layer 600, a nitride layer 202 and an oxide layer 104 stacked in this order. The multilayered film is then etched and patterned with a photoresist mask 303 to leave the multilayered film regions only over the areas where a collector contact and an emitter are going to be formed.

Figure 5B:
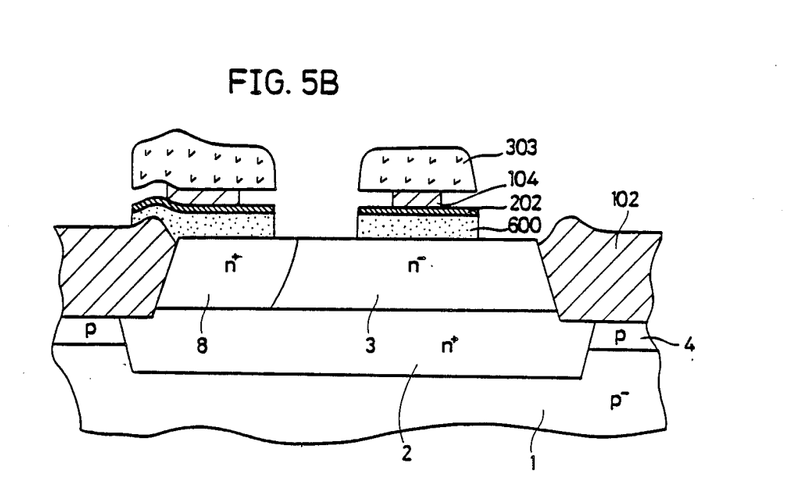

Referring to FIG. 5B, the oxide layer 104 in the multilayered film is retracted into between the nitride layer 202 and the photoresist layer 303 by side etching.

Figure 5C:
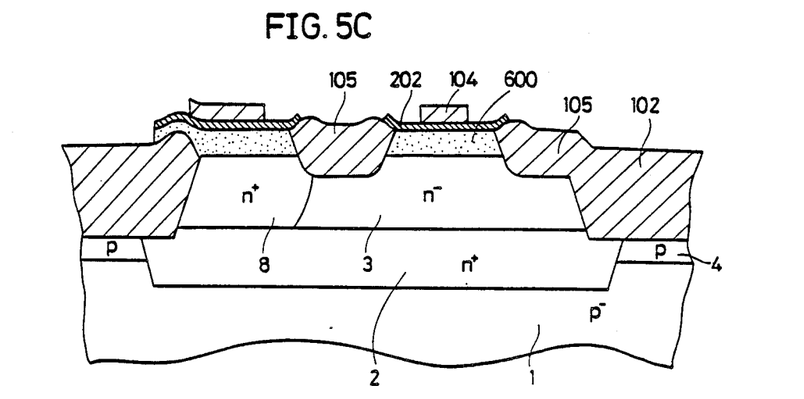

In FIG. 5C, a first oxide film pattern 105 is formed on the epitaxial layer 3, 8, utilizing the nitride layer 202 as a mask.

Figure 5D:
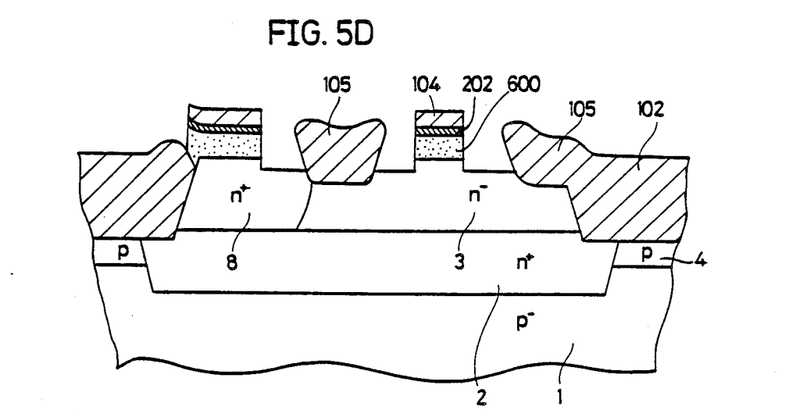

In FIG. 5D, the surface of the substance is etched down through the nitride layer 202 and the polysilicon layer 600 to a prescribed depth of the epitaxial layer 3, 8 by anisotropic etching, utilizing both the side-etched oxide layer 104 and the first oxide film 105 as a mask. The prescribed depth enables a base-emitter interface to be level with an interface between a base layer and a base electrode so that the current dependency of the current amplification factor may become smaller. Namely, the current amplification factor is surely controlled even in the range of small current by decreasing current absorption due to the recombination of electrons and positive holes in the vicinity of the base-emitter interface.

Figure 5E:
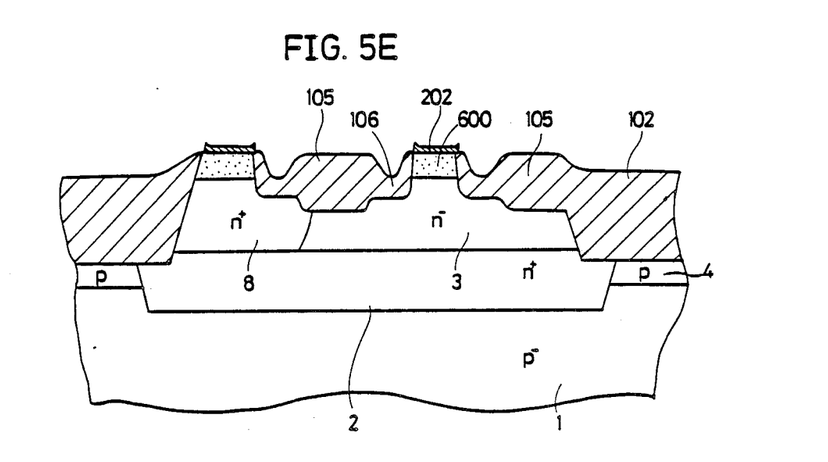

Referring to FIGS. 5D and 5E, after removal of the oxide layer 104, a second oxide film pattern 106 of 200–300 $\mu$m thickness is formed on the etched and exposed surface area between the nitride layer region 202 and the first oxide film region 105. The side walls of the polysilicon layer 600 are also covered with the second oxide film 106.

Figure 5F:
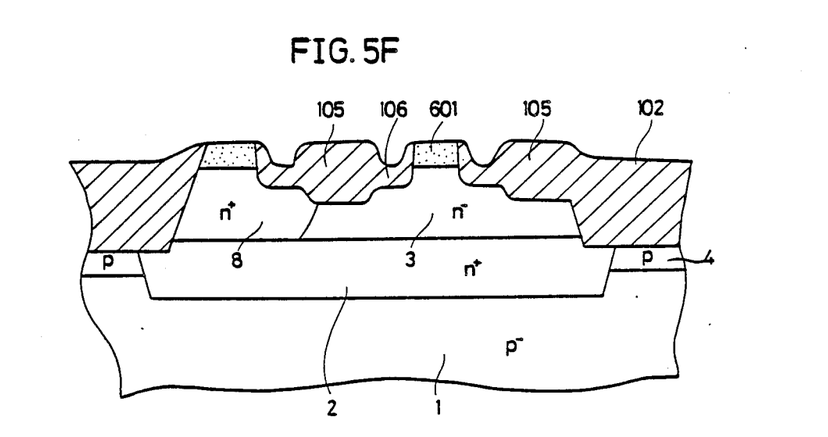

Referring to FIGS. 5E and 5F, the nitride layer 202 is removed to introduce $n^+$-type impurity into the polysilicon layer 600, utilizing the second oxide film 106 as a mask. The polysilicon layer 601 containing the $n^+$-type impurity acts as an impurity source for forming an emitter at a later stage.

Figure 5G:
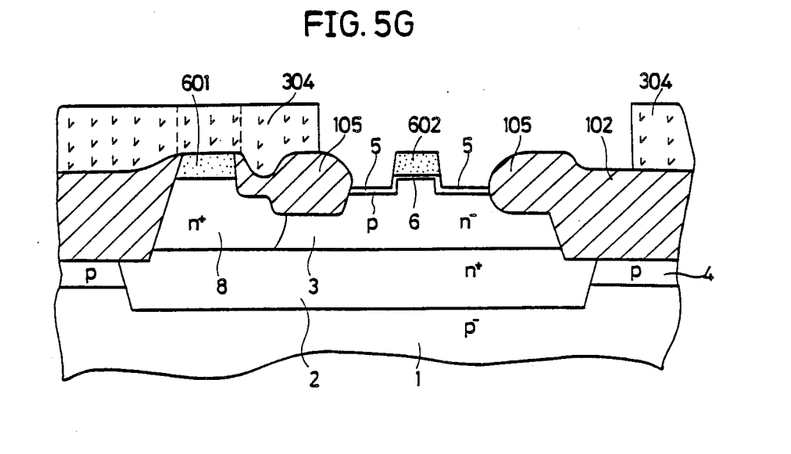

Referring to FIGS. 5F and 5G, the second oxide thin film regions 106 on the $n^-$-type epitaxial layer region 3 are removed, utilizing a resist layer mask 304 which is formed except around an area where a base and an emitter are going to be formed. On the other hand, the first oxide film pattern 105 is left to isolate a collector contact area from a base contact area. Therefore, the first oxide film pattern 105 is formed to 1 $\mu$m thickness at the stage shown in FIG. 5C. Then, with the resist mask 304, p-type impurity ions are implanted in the surface layer of the n⁻-type epitaxial layer region 3. Ion-injected layer regions 5 beneath areas, where the second oxide layer regions 106 have been removed, are formed for implementing extrinsic base layer regions at a later stage. An ion-injected region 6 beneath the polysilicon layer region 602 is formed for implementing an active base layer at a later stage. The ion-injected layer region 6 for an active base layer is naturally made thinner than the ion-injected layer regions 5 for extrinsic base layer regions, since the impurity ions must penetrate the polysilicon layer 602 to form the former region. Then, after opening a hole (shown by broken lines in FIG. 5G) through the resist layer 304 at an area for a collector contact, silicon ions are injected, utilizing the resist layer 304 as a mask. Those silicon atoms injected into areas which are not covered with the resist mask 304 are consumed later to form metal silicide electrodes.

Figure 5H:
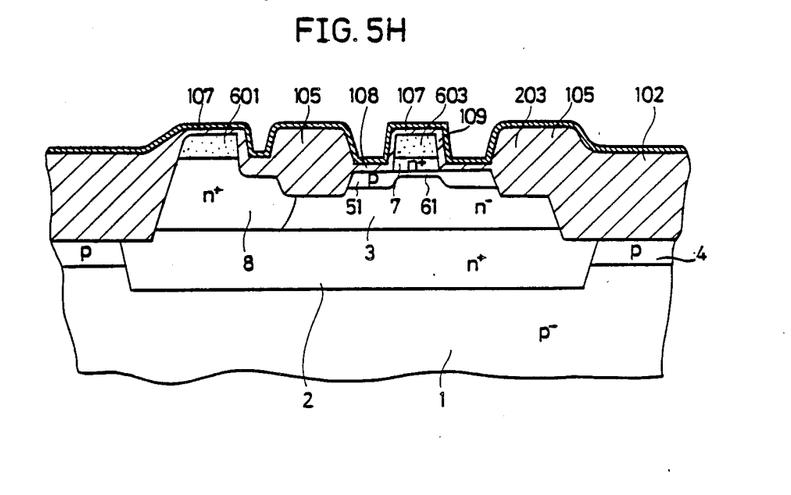

Referring to FIGS. 5G and 5H, after removal of the resist mask 304, the p-type ion-injected layer regions 5, 6 are annealed and simultaneously n⁺-type impurity is diffused from the polysilicon layer 602 into the epitaxial layer 3. As a result, an emitter 7, extrinsic base regions 51 and an active base region 61 are formed in a self-aligned manner. The extrinsic base regions 51 are naturally formed a little deeper than the active base region 61 and have a relatively lower resistivity. Then, with oxidation at a relatively lower temperature (800°–900° C.), relatively thicker oxide film regions 107 are formed on the top surfaces of the n⁺-type polysilicon layer regions 603, 601; relatively thicker oxide film regions 109 are formed on side walls of both the polysilicon layer 603 and the emitter 7; and relatively thinner oxide film regions 108 are formed on the extrinsic base regions 51. It is known that silicon or polysilicon regions containing n-type impurity are oxidized at a higher rate at a relatively lower temperature. After the oxidation, a nitride film is formed to cover the entire surface of the substance.

Figure 5I:
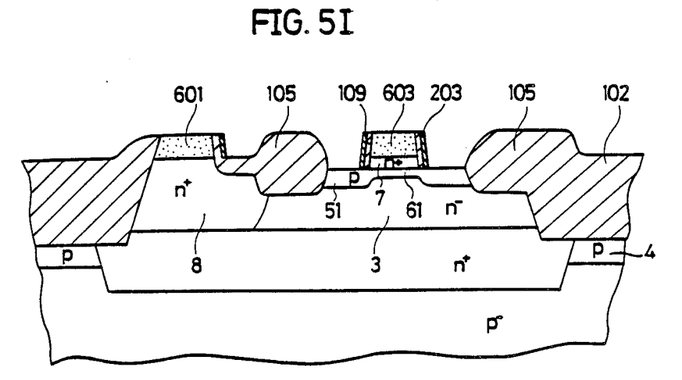

Referring to FIGS. 5H and 5I, the nitride film 203 is anisotropically etched to leave it only on the side walls of both the polysilicon layer 603 and the emitter layer 7, and then similarly oxide film regions 107, 108 are also etched away. As a result, double-layered insulator film regions comprising oxide layer 109 and nitride layer 203 are left only on the side walls of both the polysilicon layer 603 and the emitter layer 7.

Figure 5J:
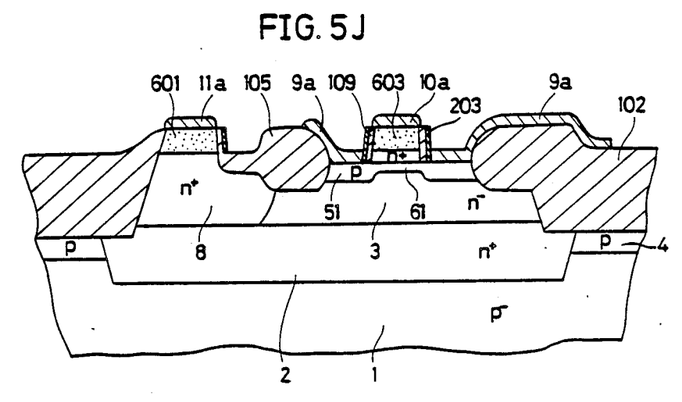

Referring to FIG. 5J, the entire surface of the substance is covered with a film of a metal such as platinum (Pt) or titanium (Ti) to form a metal silicide film by annealing over the areas where silicon ions have been injected as described referring to FIG. 5G. However, any silicide film is not formed on the side walls of both the polysilicon layer 603 and the emitter layer 7, since the side walls are covered with the double-layered insulator films. The remaining metal film regions which have not been silicidized are removed by aqua regia. As a result, a base electrode 9a, an emitter electrode 10a and a collector electrode 11a are formed of metal silicide.

Figure 5K:
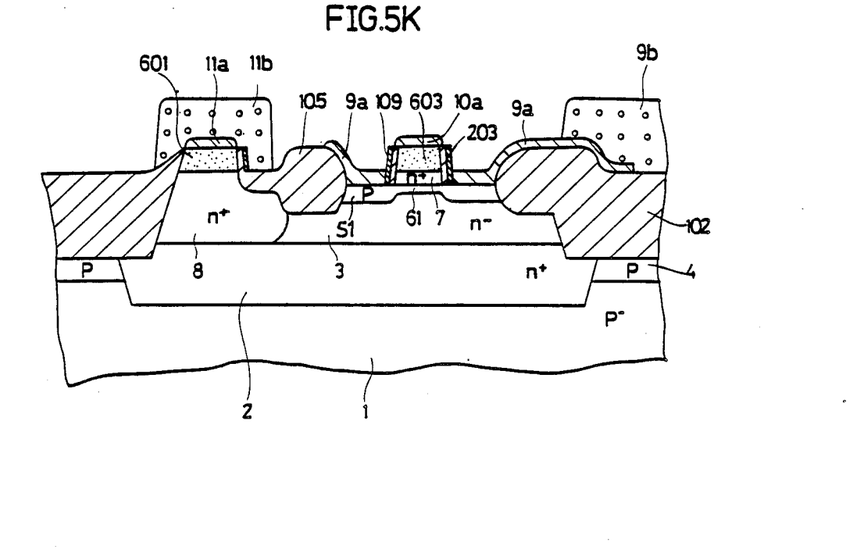

In FIG. 5K, a base lead wire 9b, an emitter lead wire 10b (not shown in this figure) and collector lead wire 11b are formed with a low resistive metal such as aluminum (Al). As seen in FIG. 5K, the base electrode 9a is separated from the emitter region 7 only by the thickness of the double-layered film 109, 203, so that the base resistance becomes very small. Further, the base area is remarkably reduced with no wide separation area between the base and emitter electrodes 9a, 10a, so that the base-collector capacitance is also reduced. Accordingly, the frequency characteristic of the transistor is much improved.

Figure 6:
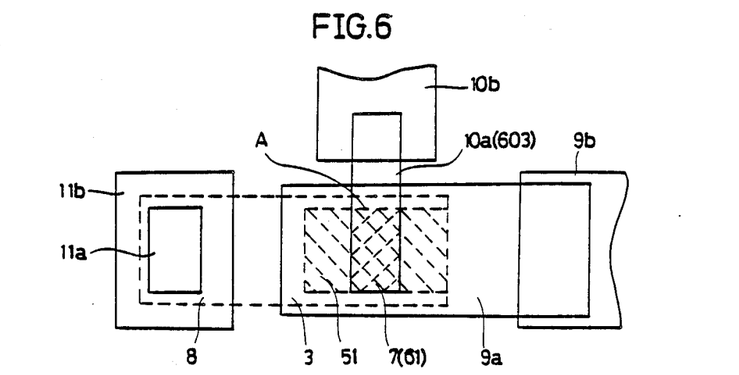
FIG. 6 is a plan view showing a pattern of double-base structure of the transistor shown in FIG. 5K.
Figure 7:
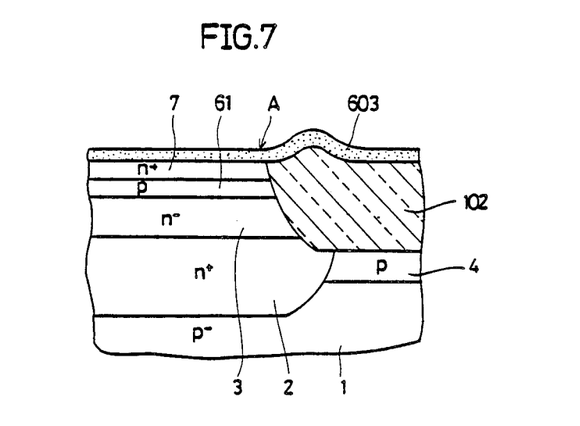
FIG. 7 is a partial enlarged sectional view showing a state in which an emitter layer of the transistor shown in FIG. 5K is bounded by an isolation oxide film.

FIG. 6 is a plan view showing a surface pattern of the transistor shown in FIG. 5K. As seen from FIGS. 5K and 6, the polysilicon film 603 have served as a diffusion source for the emitter layer 7 which is thus bounded by the isolation oxide film 102 at a portion A. The base thickness is not narrowed at the boundary A of the isolation oxide film 102 as shown in FIG. 3 but constant, since the emitter layer 7 and the active base layer 61 are simultaneously formed in a self-aligned manner to be substantially parallel to each other as shown in FIG. 7.

Further, as seen in FIG. 6, the base electrode 9a is formed around three sides of the emitter region 7 to automatically implement double-base structure, so that the base resistance can be further reduced without increasing the base region.

The width of the polysilicon layer 603 is narrowed as a result of side etching in FIG. 5B and also by invasion of the so-called bird beak of the second oxide film 106 during oxidation, so that the width finally becomes less than ⅓ of the initial one shown in FIG. 5A. Therefore, an emitter with a submicron width can be readily realized.

Further, the emitter-base interface is made to be level with the interface between the base layer 51 and the base electrode 9a. Accordingly, the current dependency of the current amplification factor becomes small.

Although formation of an n-p-n transistor has been described in the above embodiment, it goes without saying that the present invention is applicable to formation of a p-n-p transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for fabricating a bipolar transistor, comprising the steps of:
   preparing a collector layer (3, 8) of a first conductivity type surrounded by an isolation oxide layer (102) on a semiconductor substrate;
   forming a multilayered film pattern by etching with a photoresist layer mask (303) thereon, said multilayered film including a polysilicon layer (600), a nitride layer (202) and an oxide layer (104) stacked in this order on said collector layer (3, 8);
   retracting said oxide layer (104) into between said nitride layer (202) and said photoresist layer (303) by side etching;
   selectively forming a first oxide film (105) on said collector layer (3, 8), utilizing said nitride layer (202) as a mask;
   etching down through said nitride layer (202) and said polysilicon layer (600) to a prescribed depth of said collector layer (3, 8) by anisotropic etching, utilizing both said side-etched oxide layer (104) and said first oxide film (105) as a mask;
   forming a second oxide film (106) on the etched and exposed surface area between said nitride layer region (202) and said first oxide film region (105);
   removing said nitride layer (202);

introducing an impurity of said first conductivity type into said polysilicon layer (600), utilizing said second oxide film (106) as a mask;

removing some of said second oxide film regions (106) to expose a regions in which a base layer and an emitter layer are going to be formed;

implanting impurity ions into said exposed region to form a second conductivity type layer (5, 6) for implementing said base layer;

implanting silicon ions into not only said exposed region but also predetermined regions of said first oxide film (105), said predetermined regions neighboring on said exposed region;

subjecting said substrate to a heat treatment to complete said base layer (51, 61) by annealing said second conductivity type layer (5, 6) and simultaneously forming an emitter layer (7) by diffusion of said first conductivity type impurity from one (602) of said polysilicon layer regions;

subjecting said substrate to an oxidation treatment at a relatively lower temperature to cover said exposed region with an oxide film (107, 108, 109), followed by formation of a nitride film (203) thereover to provide a double-layered insulator film;

anisotropically etching said double-layered insulator film to leave it only on said side walls of both said emitter layer (7) and said polysilicon layer (603) thereon; and forming a base electrode (9a) and an emitter electrode (10a) on said silicon-implanted region, which are made of a metal silicide and insulated from each other by said double-layered insulator film (109, 203).

2. The method in accordance with claim 1, wherein said prescribed depth in the fifth step is such as to enable the base-emitter interface to be level with the interface of said base layer (51) and said base electrode (9a).

* * * * *